United States Patent
Shih et al.

(10) Patent No.: US 11,600,612 B2
(45) Date of Patent: Mar. 7, 2023

(54) SWITCH CHIP WITH BOND WIRES REPLACING TRACES IN A DIE

(71) Applicant: VIA LABS, INC., New Taipei (TW)

(72) Inventors: Didmin Shih, New Taipei (TW); Tengyi Huang, New Taipei (TW); Ting-Yen Wang, New Taipei (TW); Yen Wei Wu, New Taipei (TW)

(73) Assignee: VIA LABS, INC., New Taipei (TW)

( * ) Notice: Subject to any disclaimer, the term of this patent is extended or adjusted under 35 U.S.C. 154(b) by 0 days.

(21) Appl. No.: 17/234,310

(22) Filed: Apr. 19, 2021

(65) Prior Publication Data
US 2022/0199612 A1 Jun. 23, 2022

Related U.S. Application Data (60) Provisional application No. 63/129,872, filed on Dec. 23, 2020.

(30) Foreign Application Priority Data

Mar. 11, 2021 (TW) .................. 110108662

(51) Int. Cl.
H01L 27/02 (2006.01)
H02H 9/04 (2006.01)
H01L 23/52 (2006.01)

(52) U.S. Cl.
CPC ......... H01L 27/0292 (2013.01); H02H 9/046 (2013.01); H01L 23/52 (2013.01)

(58) Field of Classification Search
CPC . H01L 27/0292; H01L 23/52; H01L 27/0255; H01L 23/48; H01L 23/60; H02H 9/046

USPC ........................................................ 361/56
See application file for complete search history.

(56) References Cited

U.S. PATENT DOCUMENTS

| | | | | |
|---|---|---|---|---|
| 6,433,985 B1 * | 8/2002 | Voidman | ................. | H02H 9/046 361/111 |
| 6,977,420 B2 * | 12/2005 | Pasqualini | .......... | H01L 27/0255 257/355 |
| 7,450,358 B2 * | 11/2008 | Gossner | .............. | H01L 27/0251 361/56 |
| 8,698,139 B2 * | 4/2014 | Bazarjani | ................ | H01L 23/60 361/111 |

(Continued)

FOREIGN PATENT DOCUMENTS

WO 2010068490 A1 6/2010
WO 2010068490 A8 11/2010

OTHER PUBLICATIONS

Chinese Language Office Action of corresponding TW patent application dated Apr. 20, 2022.

*Primary Examiner* — Dharti H Patel
(74) *Attorney, Agent, or Firm* — McClure, Qualey & Rodack, LLP (57) ABSTRACT

A switch chip includes a first switch device, a first ESD protection device and a second ESD protection device. The first switch device is electrically coupled between a first pad and a second pad. The first ESD protection device is electrically coupled to a third pad which is electrically coupled to the first pad by a first bond wire. The second ESD protection device is electrically coupled to a fourth pad which is electrically coupled to the second pad by a second bond wire.

33 Claims, 5 Drawing Sheets

(56) References Cited

U.S. PATENT DOCUMENTS

| | | | |
|---|---|---|---|
| 9,019,669 B1* | 4/2015 | Ransijn | H02H 9/046 |
| | | | 361/56 |
| 9,537,306 B2* | 1/2017 | Tseng | H02H 9/04 |
| 9,780,085 B1* | 10/2017 | Chang | H01L 27/0262 |
| 9,929,139 B2* | 3/2018 | Fan | H01L 27/0255 |
| 10,498,564 B2* | 12/2019 | Jalali Far | H04L 25/12 |
| 2003/0058591 A1* | 3/2003 | Johnson | H01L 27/0251 |
| | | | 361/56 |
| 2006/0028776 A1* | 2/2006 | Stockinger | H01L 27/0255 |
| | | | 361/56 |
| 2007/0025035 A1* | 2/2007 | Kim | H01L 27/0266 |
| | | | 361/56 |
| 2007/0053121 A1* | 3/2007 | Chang | H02H 9/046 |
| | | | 361/56 |
| 2010/0103571 A1* | 4/2010 | Brown, Jr. | H01L 27/0248 |
| | | | 361/56 |
| 2010/0188788 A1* | 7/2010 | Padden | H01L 27/0251 |
| | | | 361/56 |
| 2011/0050288 A1 | 3/2011 | Sagae et al. | |
| 2012/0275074 A1* | 11/2012 | Dill | H01F 27/2804 |
| | | | 336/192 |
| 2013/0027824 A1* | 1/2013 | Hayano | H01L 27/0292 |
| | | | 361/56 |
| 2013/0120334 A1 | 5/2013 | Kim et al. | |
| 2014/0071567 A1* | 3/2014 | Seta | H02H 9/04 |
| | | | 361/56 |
| 2015/0163907 A1* | 6/2015 | Chang | H05K 1/0259 |
| | | | 29/841 |
| 2015/0214731 A1* | 7/2015 | Tsurui | H02H 9/046 |
| | | | 327/109 |
| 2017/0170166 A1* | 6/2017 | Song | H01L 29/866 |
| 2020/0072891 A1 | 3/2020 | Henmi et al. | |

* cited by examiner

SWITCH CHIP WITH BOND WIRES REPLACING TRACES IN A DIE

CROSS REFERENCE TO RELATED APPLICATIONS

This application claims the benefit of U.S. Provisional Application No. 63/129,872, filed on Dec. 23, 2020 and Taiwan application no. 110108662, filed on Mar. 11, 2021. The entirety of each of the above-mentioned patent applications is hereby incorporated by reference herein and made a part of this specification.

BACKGROUND OF THE INVENTION

Field of the Invention

The disclosure is generally related to a multiplexer and a demultiplexer, and more particularly it is related to a bidirectional passive N:M multiplexer and M:N demultiplexer implemented by a complementary metal oxide semiconductor process (CMOS) and having traces on the die replaced with packaged wires (i.e., bond wires), which is utilized for high-speed data transmission, where N exceeds M.

Description of the Related Art

Although processing circuitry often processes data in a parallel manner, the data are often communicated between points serially. A serializer circuit is often utilized at the transmission end of a communication link to serialize the data, and a deserializer circuit is often utilized at the reception end to deserialize the data. Bidirectional communication links commonly employ devices that perform both serialization and deserialization, with the device referred to as serializer/deserializer, or more commonly as a SerDes.

In some applications, data may be transmitted from one point to another or from one point to any number of other points, at different data rates. When the data is transmitted at different data rates, the SerDes devices utilized in such a communication link operate at corresponding different frequencies.

BRIEF SUMMARY OF THE INVENTION

Switch chips (multiplexers/demultiplexers) are provided herein. The metal trace in a die is replaced with a bond wire in a package so that the inductance between each element in the die can be precisely controlled, which also increases design flexibility. In addition, since a bond wire has less impedance, conduction loss is reduced and the dielectric loss of the metal traces in the die is also eliminated. Furthermore, different elements disposed in a die coupled through bond wires allows the operating bandwidth of the switch chip to extend so that the switch chip is able to achieve the purpose of wide operating bandwidth, low insertion loss, low return loss and high isolation.

In an embodiment, a switch chip is provided, which includes a first switch device, a first ESD protection device, and a second ESD protection device. The first switch device is electrically coupled between a first pad and a second pad. The first ESD protection device is electrically coupled to a third pad, wherein the third pad is electrically coupled to the first pad through a first bond wire. The second ESD protection device is electrically coupled to a fourth pad. The fourth pad is electrically coupled to the second pad through a second bond wire.

In another embodiment of the invention, a switch chip is provided, which includes a first switch device, a second switch device, a first ESD protection device, a second ESD protection device, and a third ESD protection device. The first switch device is electrically coupled between a first pad and a second pad. The second switch device is electrically coupled between the first pad and a third pad. The first ESD protection device is electrically coupled to a fourth pad. The fourth pad is electrically coupled to the first pad through a first bond wire. The second ESD protection device is electrically coupled to a fifth pad. The fifth pad is electrically coupled to the second pad through a second bond wire. The third ESD protection device is electrically coupled to a sixth pad. The sixth pad is electrically coupled to the third pad through a third bond wire.

In another embodiment, a switch chip is provided herein, which includes a first switch device, a second switch device, a third switch device, a fourth switch device, a fifth switch device, a sixth switch device, a first ESD protection device, a second ESD protection device, a third ESD protection device, a fourth ESD protection device, and a fifth ESD protection device. The first switch device is electrically coupled between a first pad and a second pad. The second switch device is electrically coupled between the second pad and a third pad. The third switch device is electrically coupled between a fourth pad and a fifth pad. The fourth switch device is electrically coupled between the fifth pad and a sixth pad. The fifth switch device is electrically coupled between a seventh pad and an eighth pad. The sixth switch device is electrically coupled between the eighth pad and a ninth pad. The first ESD protection device is electrically coupled to a tenth pad. The tenth pad is electrically coupled to the first pad through a first bond wire, and electrically coupled to the fourth pad through a second bond wire, and electrically coupled to the seventh pad through a third bond wire. The second ESD protection device is electrically coupled to an eleventh pad. The eleventh pad is electrically coupled to the third pad through a fourth bond wire, electrically coupled to the sixth pad through a fifth bond wire, and electrically coupled to the ninth pad through a sixth bond wire. The third ESD protection device is electrically coupled to a twelfth pad. The twelfth pad is electrically coupled to the second pad through a seventh bond wire. The fourth ESD protection device is electrically coupled to a thirteenth pad. The thirteenth pad is electrically coupled to the fifth pad through an eighth bond wire. The fifth ESD protection device is electrically coupled to a fourteenth pad. The fourteenth pad is electrically coupled to the eighth pad through a ninth bond wire.

In another embodiment, a switch chip is provided herein, which includes a first pin, a second pin, and a die. The first pin is electrically coupled to a first pad through a first bond wire. The second pin is electrically coupled to a second pad through a second bond wire. The die includes a first switch device. A terminal of the first switch device is electrically coupled to the first pad through a third bond wire, and another terminal of the first switch device is electrically coupled to the second pad through a fourth bond wire.

In an embodiment, a switch chip is provided herein, which includes a first pin, a second pin, a third pin, and a die. The first pin is electrically coupled a first pad through a first bond wire. The second pin is electrically coupled to a second pad through a second bond wire. The third pin is electrically coupled to a third pad through a third bond wire. The die includes a first switch device and a second switch device. A terminal of the first switch device is electrically coupled to the second pad through a fourth bond wire. A terminal of the second switch device is electrically coupled to the third pad through a fifth bond wire, and another terminal of the first switch device and another terminal of the second switch device both are electrically coupled to the first pad through a sixth bond wire.

In an embodiment, a switch chip includes a first pin, a second pin, a third pin, a fourth pin, a fifth pin, and a die. The first pin is electrically coupled to a first pad through a first bond wire. The second pin is electrically coupled to a second pad through a second bond wire. The third pin is electrically coupled to a third pad through a third bond wire. The fourth pin is electrically coupled to a fourth pad through a fourth bond wire. The fifth pin is electrically coupled to a fifth pad through a fifth bond wire. The die includes a first switch device, a second switch device, a third switch device, a fourth switch device, a fifth switch device, and a sixth switch device. A terminal of the first switch device is electrically coupled to the first pad through a sixth bond wire. A terminal of the second switch device is electrically coupled to the second pad through a seventh bond wire, and another terminal of the first switch device and another terminal of the second switch device both are electrically coupled to the third pad through an eighth bond wire. A terminal of the third switch device is electrically coupled to the first pad through a ninth bond wire. A terminal of the fourth switch device is electrically coupled to the second pad through a tenth bond wire, and another terminal of the third switch device and another terminal of the fourth switch device both are electrically coupled to the fourth pad through an eleventh bond wire. A terminal of the fifth switch device is electrically coupled to the first pad through a twelfth bond wire. A terminal of the sixth switch device is electrically coupled to the second pad through a thirteenth bond wire, and another terminal of the fifth switch device and another terminal of the sixth switch device both are electrically coupled to the fifth pad through a fourteenth bond wire.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Multiplexers (MUX) and demultiplexers (DEMUX) are components that are commonly used in high-speed signal specifications (such as USB, SATA, PCIe, etc.), which are used to change the transmission/reception path and the direction of the connected high-speed data stream. Generally speaking, the circuits related to multiplexers and demultiplexers include ESD protection circuits, transistors (MOSFETs), gate control signals, and metal wires connecting the transistors and the input terminal and the output terminal of data stream. The N:M multiplexer and M:N demultiplexer provided herein are suitable for high-speed data stream transmission (such as 1 Gbps or higher), where N exceeds M. Generally speaking, if the parasitic capacitance generated by the ESD protection circuit and the transistor are not absorbed, it will increase the signal loss of the data flowing through the multiplexer and demultiplexer and affect the signal integrity of the data stream, thereby reducing the transmission speed of the data stream that can be used by the multiplexer and demultiplexer. In order to reduce the adverse effects of the parasitic capacitance on the multiplexer and demultiplexer, a common way is to implement an inductor with the thick metal layer on the process provided by the fab for absorbing the parasitic capacitance, thereby reducing the influence caused by parasitic capacitance. Another way is to use the complementary metal oxide semiconductor-silicon on insulator (CMOS SOI) process. Although the two ways above is able to reduce the adverse effects of parasitic capacitance on the multiplexer and demultiplexer, the cost of the product is also increased.

Figure 1:
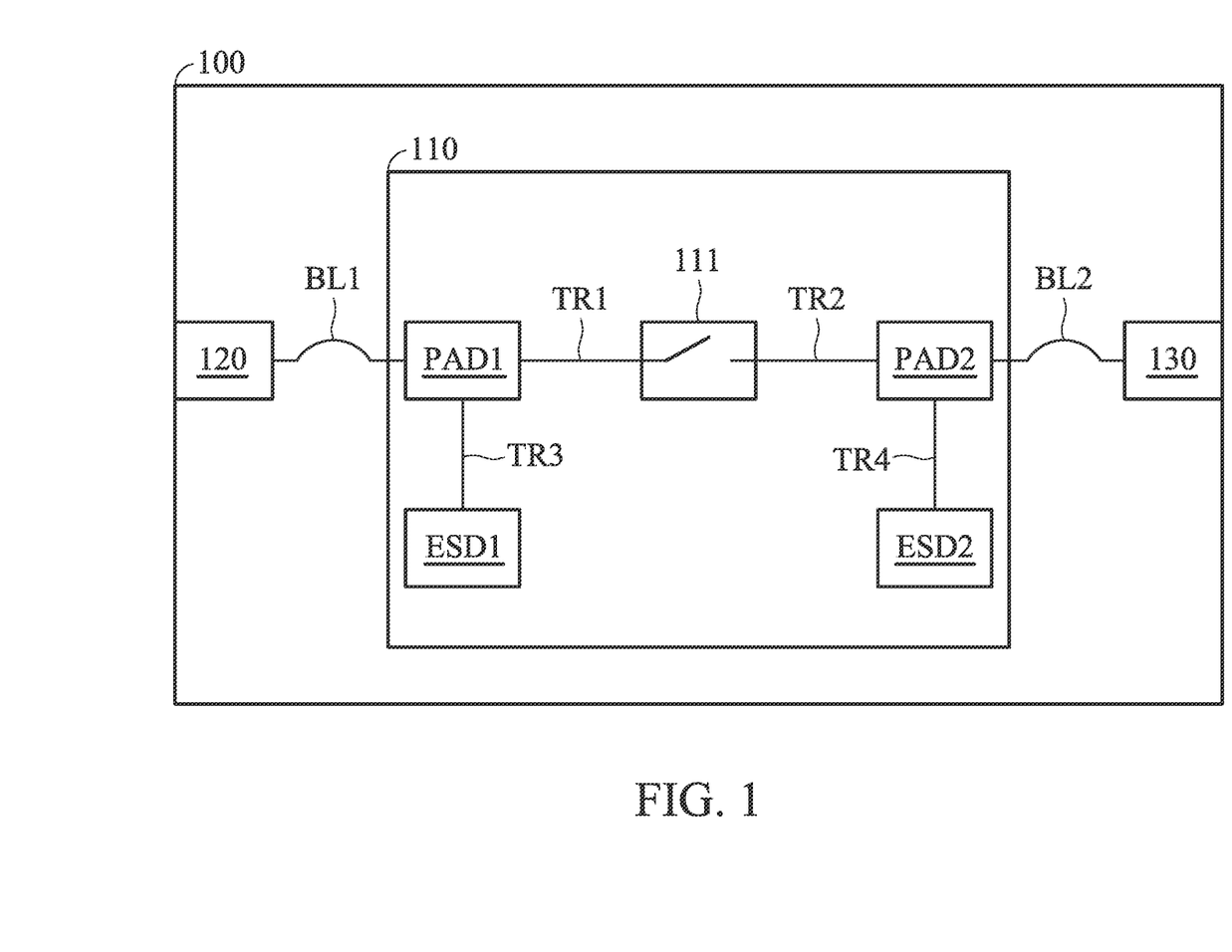
FIG. 1 is a schematic diagram of a switch chip in accordance with an embodiment of the invention.

Since the multiplexer and demultiplexer is formed by at least one switch device, a switch device is illustrated in the following paragraphs for explanation. FIG. 1 is a schematic diagram of a switch chip in accordance with an embodiment of the invention. As shown in FIG. 1, in an embodiment of the invention, the switch chip 100 is a packaged chip having a lead frame, in which the switch chip 100 includes a die 110, a first pin 120, and a second pin 130. The die 110 includes a first switch device 111, a first ESD protection device ESD1, a second ESD protection device ESD2, a first pad PAD1, and a second pad PAD2.

The first switch device 111 is electrically coupled to the first pad PAD1 through the first trace TR1 and electrically coupled to the second pad PAD2 through the second trace TR2. The first ESD protection device ESD1 is electrically coupled to the first pad PAD1, and the second ESD protection device ESD2 is electrically coupled to the second pad PAD2. According to an embodiment of the invention, the first trace TR1 and the second trace TR2 are the metal traces in the die 110. According to an embodiment of the invention, the third trace TR3 and the fourth trace TR4 are the metal traces in the die 110. The first ESD protection device ESD1 is electrically coupled to the first pad PAD1 through the third trace TR3, and the second ESD protection device ESD2 is electrically coupled to the second pad PAD2 through the fourth trace TR4. The first ESD protection device ESD1 and the second ESD protection device ESD2 are configured to protect the first switch device 111 from electrostatic discharging of the first pad PAD1 and the second pad PAD2.

The length from first ESD protection device ESD1 to the first pad PAD1 and that from the second ESD protection device ESD2 to the second pad PAD2 are so short that the effect of the third trace TR3 between the first ESD protection device ESD1 and the first pad PAD1 and the fourth trace TR4 between the second ESD protection device ESD2 and the second pad PAD2 is omitted to simplify the explanation.

As shown in FIG. 1, the first pad PAD1 of the die 110 is electrically coupled to the first pin 120 through the first bond wire BL1 and the second pad PAD2 of the die 110 is electrically coupled to the second pin 130 through the second bond wire BL2 so that the die 110 is able to be electrically coupled to other external circuit through the first pin 120 and the second pin 130.

In order to make the switch chip 100 suitable for the application purposes of wide bandwidth, low insertion loss, low return loss and high isolation, in addition to the switch chip 100 being passive, it would be the key to the design that how to reduce the dielectric loss and the conduction loss of the first trace TR1 and the second trace TR2.

In addition, since it is difficult to keep the accuracy of the etching process in the manufacturing process of the die 110, the widths and lengths of the first trace TR1 and the second trace TR2 drift very often, thereby affecting the impedance matching so as to cause signal loss.

A method of replacing the metal traces in a die with bond wires in a package that can connect the terminals of a switch device with the input terminal and output terminal of a data stream is provided herein. In an embodiment of the invention, the switch device may be a transistor, and the traces on the drain terminal and the source terminal of a transistor may be replaced with the bond wires of a package. Since the inductor formed by the bond wire can better absorb the parasitic capacitance mentioned above, and since the bond wires have a higher Q value than the metal traces in the process, the conduction loss of the data stream is thus reduced and the integrity of signals under high-speed transmission is also maintained, thereby achieving the design purposes of wide bandwidth, low insertion loss, and low return loss.

Figure 2:
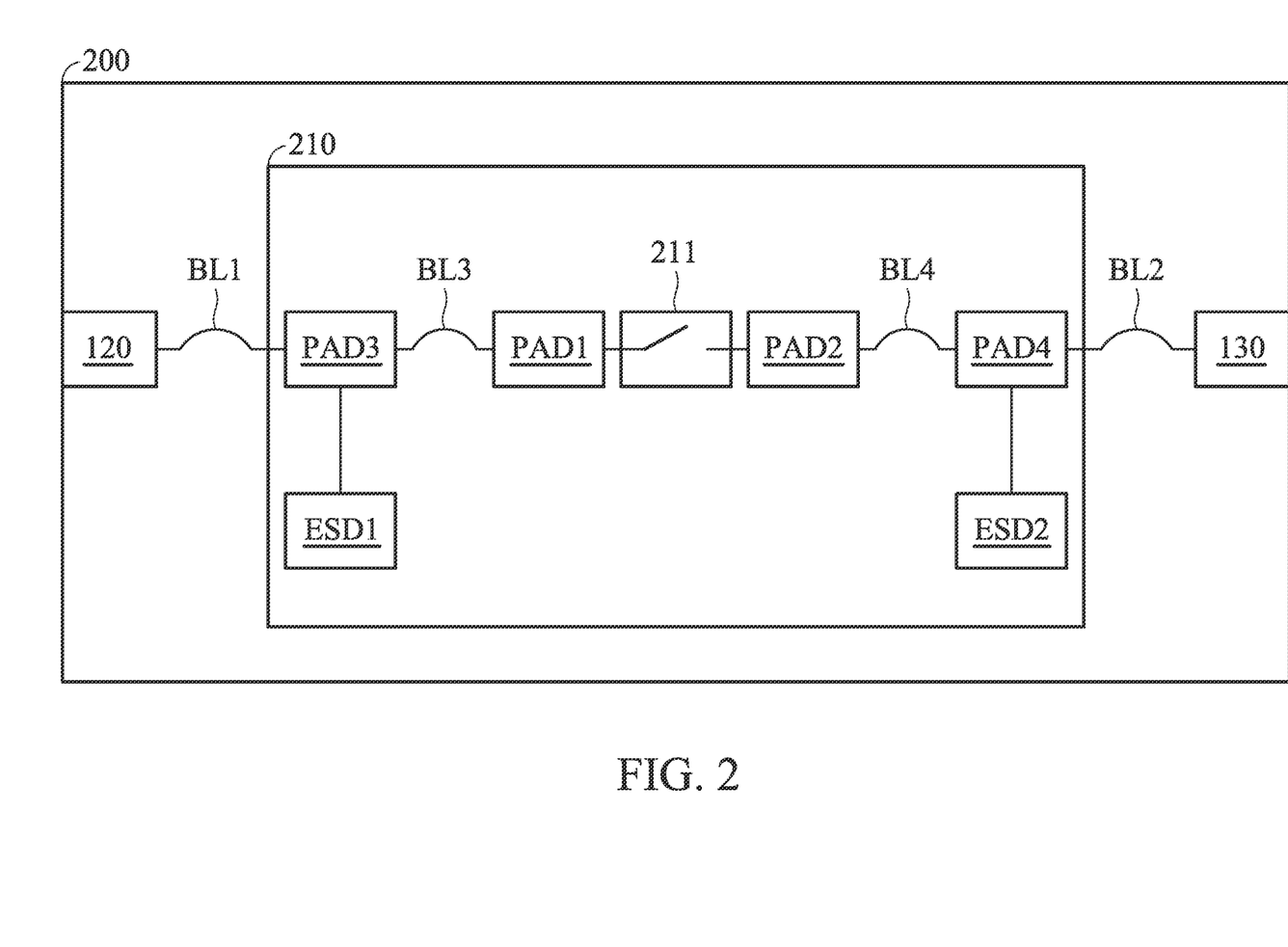
FIG. 2 is a schematic diagram of a switch chip in accordance with an embodiment of the invention.

Since the multiplexer and demultiplexer is formed by at least one switch device, a switch device is illustrated in the following paragraphs for explanation. FIG. 2 is a schematic diagram of a switch chip in accordance with an embodiment of the invention. As shown in FIG. 2, in an embodiment of the invention, the switch chip 200 is a packaged chip having a lead frame, in which the switch chip 200 includes a die 210, a first pin 120, and a second pin 130. The die 210 includes a first switch device 211, a first ESD protection device ESD1, a second ESD protection device ESD2, a first pad PAD1, a second pad PAD2, a third pad PAD3, a fourth pad PAD4, a third bond wire BL3, and a fourth bond wire BL4.

As shown in FIG. 2, the first switch device 211 is electrically coupled between the first pad PAD1 and the second pad PAD2, the first ESD protection device ESD1 is electrically coupled to the third pad PAD3, and the second ESD protection device ESD2 is electrically coupled to the fourth pad PAD4. In addition, the first pad PAD1 is electrically coupled to the third pad PAD3 through the third bond wire BL3, and the second pad PAD2 is electrically coupled to the fourth pad PAD4 through the fourth bond wire BL4.

According to an embodiment of the invention, the lengths from the first switch device 211 to the first pad PAD1 and the second pad PAD2 are so short that the effect of the traces among them can be neglected. According to an embodiment of the invention, the length from the first ESD protection device ESD1 to the third pad PAD3 and that from the second ESD protection device ESD2 to the fourth pad PAD4 are so short that the effect caused by the trace from the first ESD protection device ESD1 to the third pad PAD3 and that from the second ESD protection device ESD2 to the fourth pad PAD4 can be neglected. According to some embodiments of the invention, the first switch device 211 is an N-type transistor, or a P-type transistor. According to other embodiments of the invention, the first switch device 211 may be any other electronic element that can be utilized as a switch.

Compared the die 210 in FIG. 2 to the die 110 in FIG. 1, the first trace TR1 in FIG. 1 is replaced with the third bond wire BL3, and the second trace TR2 in FIG. 1 is replaced with the fourth bond wire BL4. According to an embodiment of the invention, the first bond wire BL1 and the second bond wire BL2 are the metal wires that are configured to electrically connect the pad to the lead frame, and the third bond wire BL3 and the fourth bond wire BL4 are the metal wires that are configured to electrically connect the pad to another pad disposed in a die.

Figure 3:
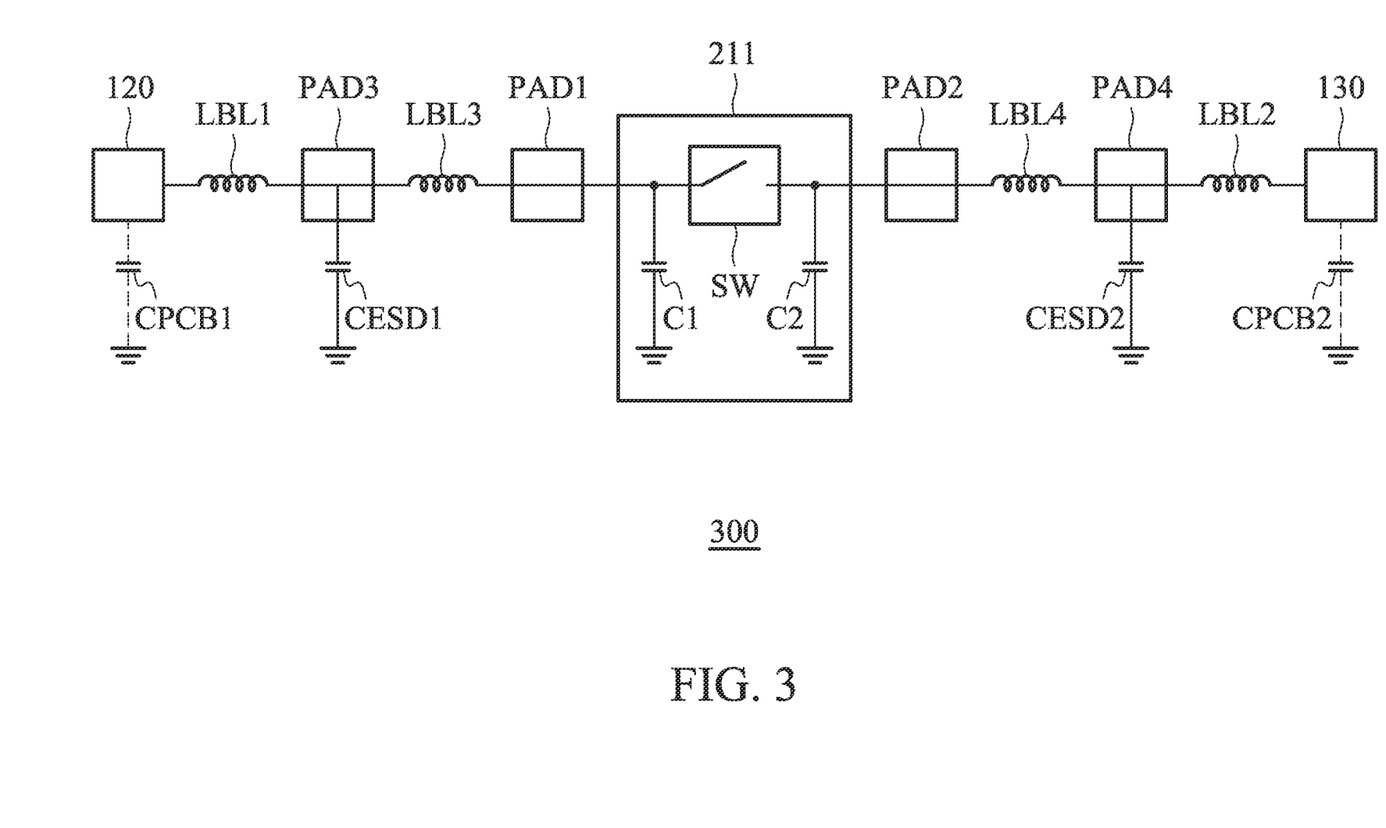
FIG. 3 is an equivalent circuit diagram of a switch chip in accordance with an embodiment of the invention.

FIG. 3 is an equivalent circuit diagram of a switch chip in accordance with an embodiment of the invention. As shown in FIG. 3, the equivalent circuit 300 is the equivalent circuit of the switch chip 200. The first bond wire inductance LBL1, the second bond wire inductance LBL2, the third bond wire inductance LBL3, and the fourth bond wire inductance LBL4 are the equivalent inductances corresponding to the first bond wire BL1, the second bond wire BL2, the third bond wire BL3, and the fourth bond wire BL4. The ESD protection device capacitance CESD1 and the second ESD protection device capacitance CESD2 are corresponding parasitic capacitances generated by the first ESD protection device ESD1 and the second ESD device ESD2 respectively.

The first switch device 211 is equivalent to an ideal switch SW, a first parasitic capacitance C1, and a second parasitic capacitance C2. The parasitic capacitance of the external printed circuit board that the first pin 120 is coupled to is equivalent to a first PCB capacitance CPCB1. The parasitic capacitance of the external printed circuit board that the second pin 130 is coupled to is equivalent to a second PCB capacitance CPCB2.

According to an embodiment of the invention, as shown in FIG. 3, the switch chip 200 may be equivalent to a LC-ladder filter, and the operation bandwidth of the switch chip 200 may be extended by the way of designing a LC-ladder filter. In addition, since the inductance of the bond wire is related to its length, the inductance of the bond wire is much easier to precisely control, compared to the width and length of the trace in a die that is difficult to be controlled due to the limitation of the etching process. Furthermore, the bond wire has a characteristic of low impedance so that the signal loss can be lowered with the trace in a die being replaced with the bond wire. Therefore, it is easier for the switch chip 200 to achieve the application purposes of wide bandwidth, low insertion loss, low return loss, and high isolation with the trace in a die being replaced with the bond wire.

Figure 4:
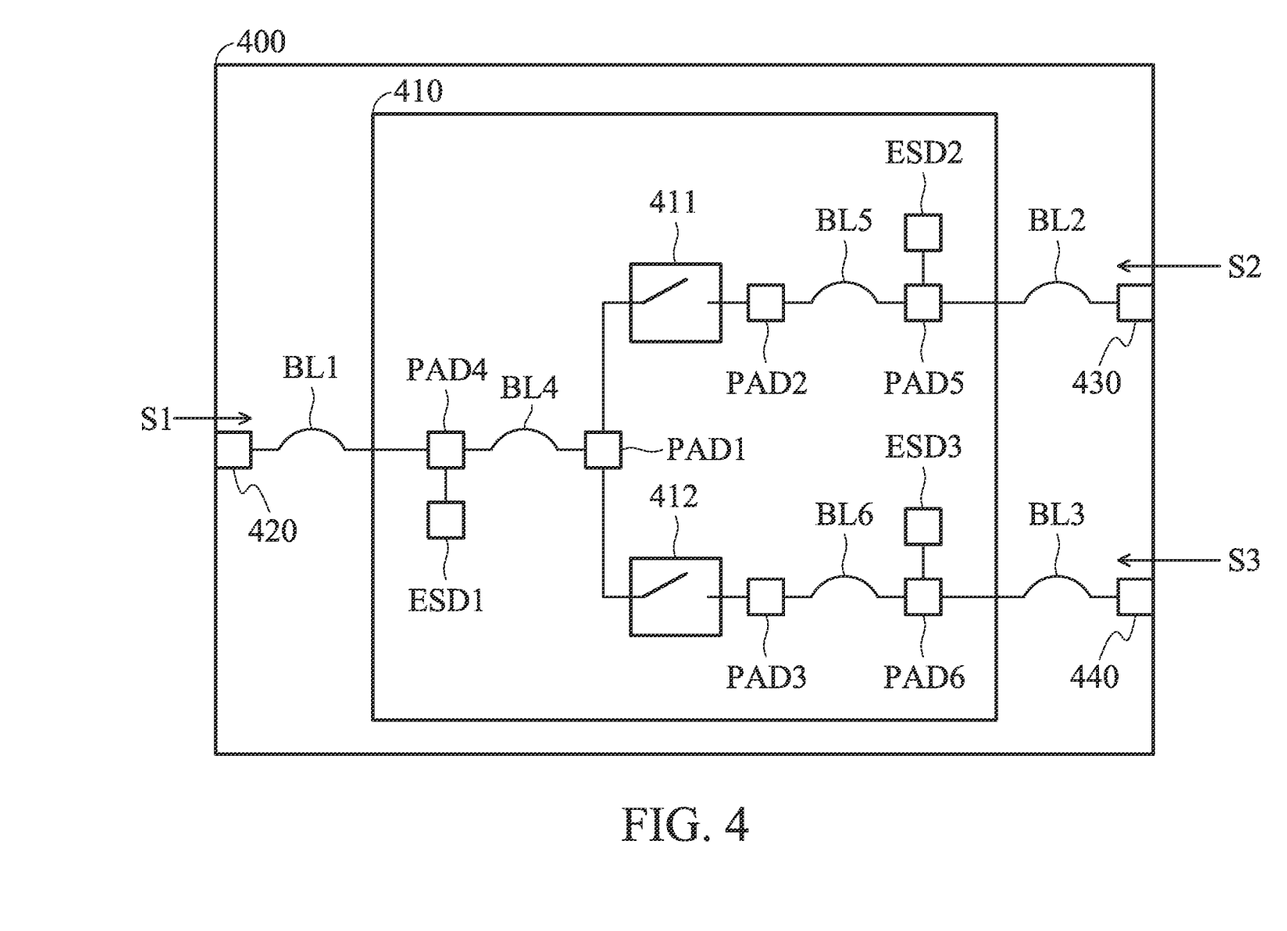
FIG. 4 is a schematic diagram of a 1:2 demultiplexer or a 2:1 multiplexer including a plurality of switch devices in accordance with another embodiment of the invention.

FIG. 4 is a schematic diagram of a 1:2 demultiplexer or a 2:1 multiplexer including a plurality of switch devices in accordance with another embodiment of the invention. As shown in FIG. 4, in an embodiment of the invention, the switch chip 400 is a packaged chip having a lead frame, in which the switch chip 400 includes a die 410, a first pin 420, a second pin 430, and a third pin 440.

The die 410 includes a first switch device 411, a second switch device 412, the first ESD protection device ESD1, a second ESD protection device ESD2, a third ESD protection device ESD3, a first pad PAD1, a second pad PAD2, a third pad PAD3, a fourth pad PAD4, a fifth pad PAD5, and a sixth pad PAD6.

The first switch device 411 is electrically coupled between the first pad PAD1 and the second pad PAD2. The second switch device 412 is electrically coupled between the first pad PAD1 and the third pad PAD3. According to an embodiment of the invention, the lengths from the first switch device 411 or the second switch device 412 to the first pad PAD1, the second pad PAD2, or the third pad PAD3 are very short so that the effect of the traces among them can be neglected. The fourth pad PAD4 is electrically coupled to the first pin 420 through the first bond wire BL1, the fifth pad PAD5 is electrically coupled to the second pin 430 through the second bond wire BL2, and the sixth pad PAD6 is electrically coupled to the third pin 440 through the third bond wire BL3.

The first ESD protection device ESD1 is electrically coupled to the fourth pad PAD4, the second ESD protection device ESD2 is electrically coupled to the fifth pad PAD5, and the third ESD protection device ESD3 is electrically coupled to the sixth pad PAD6. According to an embodiment of the invention, since the length between the first ESD protection device ESD1 and the fourth pad PAD4, that between the second ESD protection device ESD2 and the fifth pad PAD5, and that between the third ESD protection device ESD3 and the sixth pad PAD6 are very short so that the effect of the trace from the first ESD protection device ESD1 to the fourth pad PAD4, that from the second ESD protection device ESD2 to the fifth pad PAD5, and that from the third ESD protection device ESD3 to the sixth pad PAD6 can be neglected.

The first pad PAD1 is electrically coupled to the fourth pad PAD4 through the fourth bond wire BL4, the second pad PAD2 is electrically coupled to the fifth pad PAD5 through the fifth bond wire BL5, and the third pad PAD3 is electrically coupled to the sixth pad PAD6 through the sixth bond wire BL6.

According to an embodiment of the invention, the first pin 420 receives the first signal S1. According to an embodiment of the invention, when the first switch device 411 is turned on and the second switch device 412 is turned off, the switch chip 400 provides the first signal S1 to the second pin 430. According to another embodiment of the invention, when the first switch device 411 is turned off and the second switch device 412 is turned on, the switch chip 400 provides the first signal S1 to the third pin 440. At the same time, the switch chip 400 is equivalent to a 1:2 demultiplexer (the control terminal is not shown).

According to another embodiment of the invention, the second pin 430 receives the second signal S2 and the third pin 440 receives the third signal S3. According to an embodiment of the invention, when the first switch device 411 is turned on and the second switch device is turned off, the switch chip 400 provides the second signal S2 to the first pin 420. According to another embodiment of the invention, when the first switch device 411 is turned off and the second switch device 412 is turned on, the switch chip 400 provides the third signal S3 to the first pin 420. At the same time, the switch chip 400 is equivalent to a 2:1 multiplexer (the control terminal is not shown).

In other words, the switch chip 400 provides the signal that the first pin 420 receives to the second pin 430 and/or the third pin 440 according to whether the first switch device 411 and/or the second switch device 412 is turned on. On the other hand, the switch chip 400 selectively provides the signal that the second pin 430 receives, or that the third pin 440 receives, to the first pin 420 according to whether the first switch device 411 or the second switch device 412 is turned on. In an embodiment of the invention, the switch chip 400 may be a serializer or a deserializer for high-speed data transmission, such as the transmission signals for the specifications of USB, SATA, PCIE, and etc. (TX or RX), but not intended to be limited thereto.

The switch chip 400 in FIG. 4 is configured to transmit and/or to receive a single-ended signal, and two identical switch chips 400 are able to be configured to transmit and/or receive differential signals. For the simplicity of explanation, transmitting and/or receiving a single-ended signal is merely illustrated herein, but not intended to be limited thereto.

Figure 5:
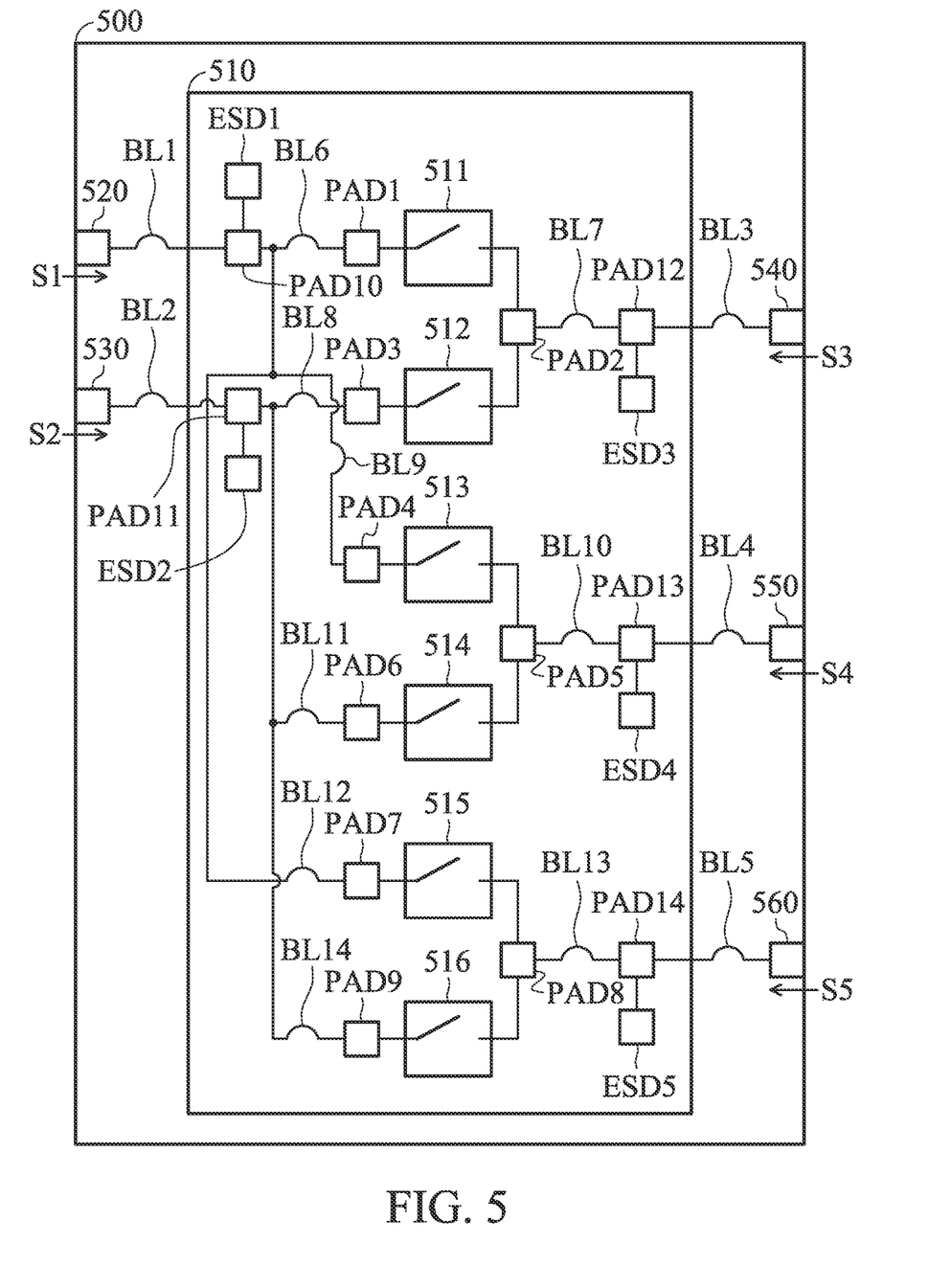
FIG. 5 is a schematic diagram of a 2:3 demultiplexer or a 3:2 multiplexer including a plurality of switch devices in accordance with another embodiment of the invention.

FIG. 5 is a schematic diagram of a 2:3 demultiplexer or a 3:2 multiplexer including a plurality of switch devices in accordance with another embodiment of the invention. As shown in FIG. 5, in an embodiment of the invention, the switch chip 500 is a packaged chip having a lead frame, in which the switch chip 500 includes a die 510, a first pin 520, a second pin 530, a third pin 540, a fourth pin 550, and a fifth pin 560.

The dies 510 includes a first switch device 511, a second switch device 512, a third switch device 513, a fourth switch device 514, a fifth switch device 515, a sixth switch device 516, a first pad PAD1, a second pad PAD2, a third pad PAD3, a fourth pad PAD4, a fifth pad PAD5, a sixth pad PAD6, a seventh pad PAD7, an eighth pad PAD8, and a ninth pad PAD9.

The first switch device 511 is electrically coupled between the first pad PAD1 and the second pad PAD2. The second switch device 512 is electrically coupled between the second pad PAD2 and the third pad PAD3. The third switch device 513 is electrically coupled between the fourth pad PAD4 and the fifth pad PAD5. The fourth switch device 514 is electrically coupled between the fifth pad PAD5 and the sixth pad PAD6. The fifth switch device 515 is electrically coupled between the seventh pad PAD7 and the eighth pad PAD8. The sixth switch device 516 is electrically coupled between the eighth pad PAD8 and the ninth pad PAD9.

According to an embodiment of the invention, since the lengths from the first switch device 511, the second switch device 512, and the third switch device 513 to the first pad PAD1, the second pad PAD2, the third pad PAD3, the fourth pad PAD4, and the fifth pad PAD5 are very short so that the effect of the traces among each switch device and each pad is neglected herein.

As shown in FIG. 5, the die 510 further includes a tenth pad PAD10, a eleventh pad PAD11, a twelfth pad PAD12, a thirteenth pad PAD13, and a fourteenth pad PAD14. The tenth pad PAD10 is electrically coupled to the first pin 520 through the first bond wire BL1, and the eleventh pad PAD11 is electrically coupled to the second pin 530 through the second bond wire BL2. The twelfth pad PAD12 is electrically coupled to the third pin 540 through the third bond wire BL3, and the thirteenth pad PAD13 is electrically coupled to the fourth pin 550 through the fourth bond wire BL4, and the fourteenth pad PAD14 is electrically coupled to the fifth pin 560 through the fifth bond wire BL5.

As shown in FIG. 5, the die 510 further includes a first ESD protection device ESD1, a second ESD protection device ESD2, a third ESD protection device ESD3, a fourth ESD protection device ESD4, and a fifth ESD protection device ESD5. The first ESD protection device ESD1 is electrically coupled to the tenth pad PAD10, the second ESD protection device ESD2 is electrically coupled to eleventh pad PAD11, the third ESD protection device ESD3 is electrically coupled to the twelfth pad PAD12, the fourth ESD protection device ESD4 is electrically coupled to the thirteenth pad PAD13, and the fifth ESD protection device ESD5 is electrically coupled to the fourteenth pad PAD14.

According to an embodiment of the invention, since the lengths from the first ESD protection device ESD1, the second ESD protection device ESD2, the third ESD protection device ESD3, the fourth ESD protection device ESD4, and the fifth ESD protection device ESD5 to the tenth pad PAD10, the eleventh pad PAD11, the twelfth pad PAD12, the thirteenth pad PAD13, and the fourteenth pad PAD14 are very short so that the effect of the traces among each ESD protection device and each pad is neglected herein.

As shown in FIG. 5, the first pad PAD1 is electrically coupled to the tenth pad PAD10 through the sixth bond wire BL6. The second pad PAD2 is electrically coupled to the twelfth pad PAD12 through the seventh bond wire BL7. The third pad PAD3 is electrically coupled to the eleventh pad PAD11 through the eighth bond wire BL8. The fourth pad PAD4 is electrically coupled to the tenth pad PAD10 through the ninth bond wire BL9. The fifth pad PAD5 is electrically coupled to the thirteenth pad PAD13 through the tenth bond wire BL10. The sixth pad PAD6 is electrically coupled to the eleventh pad PAD11 through the eleventh bond wire BL11. The seventh pad PAD7 is electrically coupled to the tenth pad PAD10 through the twelfth bond wire BL12. The eighth pad PAD8 is electrically coupled to the fourteenth pad PAD14 through the thirteenth bond wire BL13. The ninth pad PAD5 is electrically coupled to the eleventh pad PAD11 through the fourteenth bond wire BL14.

According to an embodiment of the invention, when the first pin 520 receives the first signal S1 and the second pin 530 receives the second signal S2, the switch chip 500 provides the first signal S1 and/or the second signal S2 to the third pin 540, the fourth pin 550, or the fifth pin 560 according to whether the first switch device 511, the second switch device 512, the third switch device 513, the fourth switch device 514, the fifth switch device 515, or the sixth switch device 516 is turned on. At the same time, the switch chip 500 is equivalent to a 2:3 demultiplexer (the control terminals are not shown).

According to another embodiment of the invention, when the third pin 540 receives the third signal S3, the fourth pin 550 receives the fourth signal S4, and the fifth pin 560 receives the fifth signal S5, the switch chip 500 selectively provides at least one of the third signal S3, the fourth signal S4, and the fifth signal S5 to the first pin 520 and/or the second pin 530 according to whether the first switch device 511, the second switch device 512, the third switch device 513, the fourth switch device 514, the fifth switch device 515, or the sixth switch device 516 is turned on. At the same time, the switch chip 500 is equivalent to a 3:2 multiplexer (the control terminals are not shown).

According to an embodiment of the invention, the switch chip 500 can be a serializer or a deserializer for high-speed data transmission, such as the transmission signals for the specifications of USB, SATA, PCIE, and etc. (TX or RX), but not intended to be limited thereto.

According to another embodiment of the invention, two identical switch chips 500 can be configured to transmit and/or receive differential signals. For simplicity of explanation, transmitting and/or receiving a single-ended signal is merely illustrated herein, but not intended to be limited thereto.

As mentioned above, only the parts related to the invention are shown in the switch chip 100, 200, 400, and 500, and other unrelated circuits are not shown.

Switch chips (multiplexers/demultiplexers) are provided herein. The metal trace in a die is replaced with a bond wire in a package so that the inductance between each element in the die can be precisely controlled, which also increases design flexibility. In addition, since a bond wire has less impedance, the conduction loss is reduced and the dielectric loss of the metal traces in the die is also eliminated. Furthermore, different elements disposed in a die coupled through bond wires allows the operating bandwidth of the switch chip to extend so that the switch chip is able to achieve the purpose of wide operating bandwidth, low insertion loss, low return loss and high isolation.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A switch chip, comprising:
   a first switch device, electrically coupled between a first pad and a second pad;
   a first ESD protection device, electrically coupled to a third pad, wherein the third pad is electrically coupled to the first pad through a first bond wire; and
   a second ESD protection device, electrically coupled to a fourth pad, wherein the fourth pad is electrically coupled to the second pad through a second bond wire.

2. The switch chip as defined in claim 1, wherein the first switch device, the first ESD protection device, the second ESD protection device, the first pad, the second pad, the third pad, and the fourth pad are deposited in a die.

3. The switch chip as defined in claim 2, further comprising:
a first pin, electrically coupled to the third pad through a third bond wire; and
a second pin, electrically coupled to the fourth pad through a fourth bond wire.

4. The switch chip as defined in claim 3, wherein the die, the first pin, and the second pin are deposited in a package.

5. A switch chip, comprising:
a first switch device, electrically coupled between a first pad and a second pad;
a second switch device, electrically coupled between the first pad and a third pad;
a first ESD protection device, electrically coupled to a fourth pad, wherein the fourth pad is electrically coupled to the first pad through a first bond wire;
a second ESD protection device, electrically coupled to a fifth pad, wherein the fifth pad is electrically coupled to the second pad through a second bond wire; and
a third ESD protection device, electrically coupled to a sixth pad, wherein the sixth pad is electrically coupled to the third pad through a third bond wire.

6. The switch chip as defined in claim 5, wherein the first switch device, the second switch device, the first ESD protection device, the second ESD protection device, and the third ESD protection device are deposited in a die.

7. The switch chip as defined in claim 6, further comprising:
a first pin, electrically coupled to the fourth pad through a fourth bond wire;
a second pin, electrically coupled to the fifth pad through a fifth bond wire; and
a third pin, electrically coupled to the sixth pad through a sixth bond wire.

8. The switch chip as defined in claim 7, wherein the die, the first pin, the second pin, and the third pin are deposited in a package.

9. The switch chip as defined in claim 7, wherein the first pin receives a first signal, wherein when the first switch device is turned on and the second switch device is turned off, the first signal is provided to the second pin, wherein when the first switch device is turned off and the second switch device is turned on, the first signal is provided to the third pin.

10. The switch chip as defined in claim 7, wherein the second pin receives a first signal and the third pin receives a second signal, wherein when the first switch device is turned on and the second switch device is turned off, the first signal is provided to the first pin, wherein when the first switch device is turned off and the second switch device is turned on, the second signal is provided to the first pin.

11. The switch chip as defined in claim 5, wherein the switch chip is one of a serializer, a deserializer, a N:M multiplexer, or a M:N demultiplexer, wherein N exceeds M.

12. A switch chip, comprising:
a first switch device, electrically coupled between a first pad and a second pad;
a second switch device, electrically coupled between the second pad and a third pad;
a third switch device, electrically coupled between a fourth pad and a fifth pad;
a fourth switch device, electrically coupled between the fifth pad and a sixth pad;
a fifth switch device, electrically coupled between a seventh pad and an eighth pad;
a sixth switch device, electrically coupled between the eighth pad and a ninth pad;
a first ESD protection device, electrically coupled to a tenth pad, wherein the tenth pad is electrically coupled to the first pad through a first bond wire, and electrically coupled to the fourth pad through a second bond wire, and electrically coupled to the seventh pad through a third bond wire;
a second ESD protection device, electrically coupled to an eleventh pad, wherein the eleventh pad is electrically coupled to the third pad through a fourth bond wire, electrically coupled to the sixth pad through a fifth bond wire, and electrically coupled to the ninth pad through a sixth bond wire;
a third ESD protection device, electrically coupled to a twelfth pad, wherein the twelfth pad is electrically coupled to the second pad through a seventh bond wire;
a fourth ESD protection device, electrically coupled to a thirteenth pad, wherein the thirteenth pad is electrically coupled to the fifth pad through an eighth bond wire; and
a fifth ESD protection device, electrically coupled to a fourteenth pad, wherein the fourteenth pad is electrically coupled to the eighth pad through a ninth bond wire.

13. The switch chip as defined in claim 12, wherein the first switch device, the second switch device, the third switch device, the fourth switch device, the fifth switch device, the sixth switch device, the first ESD protection device, the second ESD protection device, the third ESD protection device, the fourth ESD protection device, and the fifth ESD protection device are deposited in a die.

14. The switch chip as defined in claim 13, further comprising:
a first pin, electrically coupled to the tenth pad through a tenth bond wire;
a second pin, electrically coupled to the eleventh pad through an eleventh bond wire;
a third pin, electrically coupled to the twelfth pad through a twelfth bond wire;
a fourth pin, electrically coupled to the thirteenth pad through a thirteenth bond wire; and
a fifth pin, electrically coupled to the fourteenth pad through a fourteenth bond wire.

15. The switch chip as defined in claim 14, wherein the die, the first pin, the second pin, the third pin, the fourth pin, and the fifth pin are deposited in a package.

16. The switch chip as defined in claim 14, wherein the first pin receives a first signal and the second pin receives a second signal, wherein the switch chip provides the first signal and/or the second signal to the third pin, the fourth pin, or the fifth pin according to whether the first switch device, the second switch device, the third switch device, the fourth element, the fifth element, or the sixth element is turned on.

17. The switch chip as defined in claim 14, wherein the third pin receives a third signal, the fourth pin receives a fourth signal, and the fifth pin receives a fifth signal, wherein the switch chip selectively provides at least one of the third signal, the fourth signal, and the fifth signal to the first pin and/or the second pin according to whether the first switch device, the second switch device, the third switch device, the fourth switch device, the fifth switch device, or the sixth switch device is turned on.

18. The switch chip as defined in claim 12, wherein the switch chip is a N:M multiplexer or a M:N demultiplexer, wherein N exceeds M.

19. A switch chip, comprising:
a first pin, electrically coupled to a first pad through a first bond wire;
a second pin, electrically coupled to a second pad through a second bond wire; and
a die, comprising a first switch device, wherein a terminal of the first switch device is electrically coupled to the first pad through a third bond wire, and another terminal of the first switch device is electrically coupled to the second pad through a fourth bond wire.

20. The switch chip as defined in claim 19, wherein the first pad, the second pad, the third bond wire, and the fourth bond wire are deposited in the die.

21. The switch chip as defined in claim 19, wherein the die further comprises:
a first ESD protection device, electrically coupled to the first pad; and
a second ESD protection device, electrically coupled to the second pad.

22. A switch chip, comprising:
a first pin, electrically coupled a first pad through a first bond wire;
a second pin, electrically coupled to a second pad through a second bond wire;
a third pin, electrically coupled to a third pad through a third bond wire; and
a die, comprising:
a first switch device, wherein a terminal of the first switch device is electrically coupled to the second pad through a fourth bond wire; and
a second switch device, wherein a terminal of the second switch device is electrically coupled to the third pad through a fifth bond wire, and another terminal of the first switch device and another terminal of the second switch device both are electrically coupled to the first pad through a sixth bond wire.

23. The switch chip as defined in claim 22, wherein the first pad, the second pad, the third pad, the fourth bond wire, the fifth bond wire, and the sixth bond wire are disposed in the die.

24. The switch chip as defined in claim 22, wherein the die further comprises:
a first ESD protection device, electrically coupled to the first pad;
a second ESD protection device, electrically coupled to the second pad; and
a third ESD protection device, electrically coupled to the third pad.

25. The switch chip as defined in claim 22, wherein the switch chip is a serializer, a deserializer, a N:M multiplexer, or a M:N demultiplexer, wherein N exceeds M.

26. The switch chip as defined in claim 22, wherein the first pin receives a first signal, wherein when the first switch device is turned on and the second switch device is turned off, the first signal is provided to the second pin, wherein when the first switch device is turned off and the second switch device is turned on, the first signal is provided to the third pin.

27. The switch chip as defined in claim 22, wherein the second pin receives a first signal and the third pin receives a second signal, wherein when the first switch device is turned on and the second switch device is turned off, the first signal is provided to the first pin, wherein when the first switch device is turned off and the second switch device is turned on, the second signal is provided to the first pin.

28. A switch chip, comprising:
a first pin, electrically coupled to a first pad through a first bond wire;
a second pin, electrically coupled to a second pad through a second bond wire;
a third pin, electrically coupled to a third pad through a third bond wire;
a fourth pin, electrically coupled to a fourth pad through a fourth bond wire;
a fifth pin, electrically coupled to a fifth pad through a fifth bond wire; and
a die, comprising:
a first switch device, wherein a terminal of the first switch device is electrically coupled to the first pad through a sixth bond wire;
a second switch device, wherein a terminal of the second switch device is electrically coupled to the second pad through a seventh bond wire, and another terminal of the first switch device and another terminal of the second switch device both are electrically coupled to the third pad through an eighth bond wire;
a third switch device, wherein a terminal of the third switch device is electrically coupled to the first pad through a ninth bond wire;
a fourth switch device, wherein a terminal of the fourth switch device is electrically coupled to the second pad through a tenth bond wire, and another terminal of the third switch device and another terminal of the fourth switch device both are electrically coupled to the fourth pad through an eleventh bond wire;
a fifth switch device, wherein a terminal of the fifth switch device is electrically coupled to the first pad through a twelfth bond wire; and
a sixth switch device, wherein a terminal of the sixth switch device is electrically coupled to the second pad through a thirteenth bond wire, and another terminal of the fifth switch device and another terminal of the sixth switch device both are electrically coupled to the fifth pad through a fourteenth bond wire.

29. The switch chip as defined in claim 28, wherein the first pad, the second pad, the third pad, the fourth pad, the fifth pad are disposed in the die.

30. The switch chip as defined in claim 28, wherein the die further comprises:
a first ESD protection device, electrically coupled to the first pad;
a second ESD protection device, electrically coupled to the second pad;
a third ESD protection device, electrically coupled to the third pad;
a fourth ESD protection device, electrically coupled to the fourth pad; and
a fifth ESD protection device, electrically coupled to the fifth pad.

31. The switch chip as defined in claim 28, wherein the switch chip is a N:M multiplexer or a M:N demultiplexer, wherein N exceeds M.

32. The switch chip as defined in claim 28, wherein the first pin receives a first signal and the second pin receives a second signal, wherein the switch chip provides the first signal and/or the second signal to the third pin, the fourth pin, or the fifth pin according to whether the first switch device, the second switch device, the third switch device, the fourth switch device, the fifth switch device, or the sixth switch device is turned on.

33. The switch chip as defined in claim 28, wherein the third pin receives a third signal, the fourth pin receives a fourth signal, and the fifth pin receives a fifth signal, wherein the switch chip selectively provides at least one of the third signal, the fourth signal, and the fifth signal to the first pin and/or the second pin according to whether the first switch device, the second switch device, the third switch device, the fourth switch device, the fifth switch device, or the sixth switch device is turned on.

* * * * *